(12) United States Patent
Onozawa et al.

(10) Patent No.: US 7,045,446 B2
(45) Date of Patent: May 16, 2006

(54) SEMICONDUCTOR DEVICE FABRICATION METHOD

(75) Inventors: Kazutoshi Onozawa, Osaka (JP); Daisuke Ueda, Osaka (JP); Tomoaki Tojo, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 221 days.

(21) Appl. No.: 10/840,422

(22) Filed: May 7, 2004

(65) Prior Publication Data

US 2005/0003570 A1    Jan. 6, 2005

(30) Foreign Application Priority Data

May 7, 2003 (JP) .............................. 2003-129378

(51) Int. Cl.
*H01L 21/20* (2006.01)
*H01L 21/36* (2006.01)

(52) U.S. Cl. ........................... 438/497; 438/500
(58) Field of Classification Search ............... None
See application file for complete search history.

(56) References Cited

U.S. PATENT DOCUMENTS

| | | | |
|---|---|---|---|
| 5,258,320 A * | 11/1993 | Zavracky et al. .......... 438/27 |
| 5,545,291 A | 8/1996 | Smith et al. |
| 5,783,856 A | 7/1998 | Smith et al. |
| 5,824,186 A | 10/1998 | Smith et al. |
| 5,904,545 A | 5/1999 | Smith et al. |
| 6,716,773 B1 * | 4/2004 | Egami et al. ............... 438/798 |
| 2003/0062599 A1 * | 4/2003 | Egami et al. ............... 257/632 |
| 2004/0056268 A1 * | 3/2004 | Onozawa et al. .......... 257/99 |
| 2004/0063233 A1 * | 4/2004 | Onozawa ..................... 438/22 |
| 2004/0140199 A1 * | 7/2004 | Mizohata et al. .......... 204/212 |

FOREIGN PATENT DOCUMENTS

| | | |
|---|---|---|
| JP | 11-144307 A | 5/1999 |
| JP | 11-149652 A | 6/1999 |
| JP | 11-186651 A | 7/1999 |

* cited by examiner

*Primary Examiner*—Ngân V. Ngô
(74) *Attorney, Agent, or Firm*—McDermott Will & Emery LLP

(57) ABSTRACT

In a semiconductor device fabrication method using a fluidic self-assembly technique in which in a liquid, a plurality of semiconductor elements are mounted in a self-aligned manner on a substrate with a plurality of recessed portions formed therein, protruding potions that are inserted in the respective recessed portions of the substrate are formed in the lower portions of the respective semiconductor elements, the liquid in which the semiconductor elements have been spread is poured over the substrate intermittently, and the substrate is rotated in a period of time in which the liquid is not poured.

21 Claims, 13 Drawing Sheets

SEMICONDUCTOR DEVICE FABRICATION METHOD

BACKGROUND OF THE INVENTION

The present invention relates to methods for fabricating semiconductor devices, and more particularly relates to semiconductor device fabrication methods which enable semiconductor light emitters, such as semiconductor laser devices, to be mounted in a self-aligned manner.

Typical digital-versatile-disc (hereinafter referred to as "DVD") players and recorders need to have the capability of playing back not only DVDs but also compact discs (hereinafter referred to as "CDs"), and also have to include the capability of reproducing, and storing data on, recordable CDs (CD-Rs) which have become widespread rapidly in recent years.

As light for reproducing DVDs, a red laser beam with a wavelength in the 650 nm band is employed, while an infrared laser beam with a wavelength in the 780 nm band is used as light for playing back CDs and CD-R discs. Thus, in the currently available DVD players and recorders, two semiconductor laser diodes are incorporated in the form of an array: a red semiconductor laser diode for generating a red laser beam and an infrared semiconductor laser diode for generating an infrared laser beam.

With an increasing demand for smaller information equipment such as personal computers, DVD players and recorders also need to be further reduced in size and thickness. To that end, it is indispensable to decrease the size and thickness of optical pickups. A method for reducing the size and thickness of an optical pickup is to simplify an optical system.

As one method for simplifying an optical system, integration of a red semiconductor laser diode and an infrared semiconductor laser diode is considered. The current DVD players and recorders include two types of optical system components for a red semiconductor laser diode and an infrared semiconductor laser diode. Integration of the two semiconductor laser diodes, that is, the red and infrared semiconductor laser diodes, allows an optical system component to be shared, thereby realizing an optical pickup of smaller size and thickness.

For instance, as one example of the integration of a red semiconductor laser diode and an infrared semiconductor laser diode, a so-called monolithic semiconductor laser diode array integrated on a single substrate is disclosed in Japanese Laid-Open Publication No. 11-186651.

Also, Japanese Laid-Open Publication Nos. 11-144307 and 11-149652 disclose other examples of an optical pickup, in which optical-system-component sharing is achieved by hybrid integration of two semiconductor laser chips for a red laser and an infrared laser.

Nevertheless, in the conventional monolithic two-wavelength laser diode array, active layers of the respective laser diodes have different compositions and thus have to be grown in different process steps, which results in the problem of low yields. In particular, when high-output laser diodes are monolithically integrated, yields decrease significantly.

Moreover, it is very difficult, from the viewpoint of crystal growth, to monolithically integrate a gallium nitride (GaN)-based blue laser diode, which is used in high density DVDs, and an aluminum gallium indium phosphide (AlGaInP)-based red laser diode.

The conventional hybrid optical pickup, on the other hand, have the problem that when the red semiconductor laser chip and the infrared semiconductor laser chip are assembled using assembly equipment, it is difficult to adjust and optimize the locations of the active layers of, and the distance between the light emitting points of, the semiconductor laser chips.

In recent years, a mounting method in which a fluidic self-assembly technique is used has been developed as one type of device-mounting method.

In the fluidic self-assembly technique, devices (hereinafter referred to as "function blocks") ranging in size from 10 μm to several hundred μm and having a given shape are spread in a liquid to form a slurry. The liquid (suspension) in the form of slurry is poured over the surface of a substrate of, e.g., silicon having recessed portions therein. The recessed portions are substantially the same as the function blocks in terms of size and shape. In this manner, the function blocks spread in the liquid are placed in the recessed portions and thereby mounted onto the substrate.

However, the conventional fluidic self-assembly process has a drawback in that it is not easy to form in the substrate the recessed portions into which the function blocks are inserted, which results in low productivity.

SUMMARY OF THE INVENTION

An object of the present invention is that in a semiconductor device formed by hybrid integration of semiconductor elements, the semiconductor elements are easily and reliably mounted onto a substrate by using a fluidic self-assembly technique during fabrication.

To achieve the object, in an inventive semiconductor device fabrication method using a fluidic self-assembly technique, protruding potions that are placed in recessed portions in a substrate are formed in the lower portions of respective semiconductor elements, a liquid in which the semiconductor elements have been spread is poured over the substrate, and the substrate is rotated in a period of time in which the liquid is not poured.

Specifically, an inventive method for fabricating a semiconductor device includes the steps of: (a) forming a plurality of recessed portions in the principal surface of a substrate, and (b) spreading in a liquid a plurality of semiconductor elements, each of which is in the form of a chip and has, in its lower portion, a protruding portion that is inserted in one of the recessed portions, and pouring the semiconductor-element-spread liquid over the principal surface of the substrate, thereby allowing the semiconductor elements to be placed in the respective recessed portions in a self-aligned manner. The step (b) includes a first period of time in which the semiconductor-element-spread liquid is poured over the principal surface of the substrate, and a second period of time in which the semiconductor-element-spread liquid is not poured over the principal surface of the substrate, and the substrate is not rotated in the first period of time, while the substrate is rotated in the second period of time.

In the inventive semiconductor device fabrication method, the substrate is not rotated and stands still in the first period of time in which the semiconductor-element-spread liquid is poured over the principal surface of the substrate. Thus, the protruding portions of the semiconductor elements are placed more easily in the respective recessed portions formed in the substrate. In addition, the substrate is rotated in the second period of time in which the semiconductor-element-spread liquid is not poured over the principal surface of the substrate. It is thus possible to remove those semiconductor elements that are caught in the recessed portions in the substrate in improper directions, and those semiconductor elements that are hooked on the other semiconductor elements that have been placed in the recessed portions in the appropriate direction. Furthermore, the rotation of the substrate changes the relative position, on the substrate, of those other semiconductor elements that have been properly placed in the recessed portions in the substrate, with respect to the direction in which the liquid flows, such that the semiconductor elements existing in the liquid are not obstructed. Accordingly, the semiconductor elements are placed in the recessed portions reliably.

In the inventive semiconductor device fabrication method, in the second period of time, the substrate is preferably rotated in the principal surface thereof by at least 90 degrees.

In the inventive semiconductor device fabrication method, the step (b) preferably includes a process in which the first period of time and the second period of time are repeated alternately.

In the inventive semiconductor device fabrication method, the substrate is preferably held with the principal surface thereof being slanting with respect to a horizontal direction. Then, when the substrate is rotated, those semiconductor elements that have not been placed in the recessed portions are reliably removed from the substrate.

In the inventive semiconductor device fabrication method, in the step (b), the recessed portions are preferably formed so as to vary in shape in accordance with the plan shapes of the protruding portions of the respective semiconductor elements. Then, if the semiconductor elements are semiconductor laser elements that have different wavelengths, for example, and if the recessed portions are formed having different plan shapes, then an optical pickup system that outputs different wavelengths, like a two-wavelength laser device, can be realized.

In the inventive semiconductor device fabrication method, the protruding portion of each semiconductor element preferably has a plan configuration which does not have line symmetry at least with respect to one of two intersecting axes, or has a plan configuration which does not have rotational symmetry. Then, the upper and bottom sides and front and rear facets of the respective semiconductor elements are selected in a self-aligned manner. Therefore, even if the fluidic self-assembly technique is used, the semiconductor elements are easily and reliably mounted on the substrate.

In the inventive semiconductor device fabrication method, in the step (a), the depth dimension of the recessed portions is preferably greater than or equal to the height dimension of the protruding portions of the semiconductor elements. Then, the semiconductor elements are reliably placed in the recessed portions in the substrate.

The inventive semiconductor device fabrication method preferably further includes, before the step (b), the step (c) of forming the semiconductor elements into the chips, and the protruding portions of the semiconductor elements are preferably formed by an etching process in the step (c).

In the inventive semiconductor device fabrication method, the protruding portions of the semiconductor elements are preferably formed of a plating material in the step (c).

The inventive semiconductor device fabrication method preferably further includes, before the step (b), the step (c) of forming the semiconductor elements into the chips, and the protruding portions of the semiconductor elements are preferably formed of a resist material in the step (c).

The inventive semiconductor device fabrication method preferably further includes, before the step (b), the step (c) of forming the semiconductor elements into the chips, and the protruding portions of the semiconductor elements are preferably formed of a polyimide material in the step (c).

In that case, the polyimide material is preferably photosensitive.

In the inventive semiconductor device fabrication method, the protruding portions of the semiconductor elements are preferably formed of a benzo cyclo butene (BCB) material in the step (c).

In that case, the benzo cyclo butene material is preferably photosensitive.

The inventive semiconductor device fabrication method preferably further includes, before the step (b), the step (c) of forming the semiconductor elements into the chips, and the protruding portions of the semiconductor elements are preferably formed of an acrylic material in the step (c).

In that case, the acrylic material is preferably photosensitive.

As described above, if the protruding portions of the semiconductor elements are formed of a photosensitive material, the protruding portions are formed accurately and productively by a photolithography process.

In the inventive semiconductor device fabrication method, the liquid is preferably an organic solvent. Then, a material that causes no corrosion, e.g., can be selected as the material that forms the substrate, the semiconductor elements and the protruding portions thereof.

In the inventive semiconductor device fabrication method, the specific gravity of the liquid is preferably smaller than the specific gravity of the semiconductor elements, and the step (b) preferably includes a process in which the specific gravity of the liquid is adjusted so that the semiconductor elements are disposed on the substrate in a self-aligned manner at a maximum efficiency.

In the inventive semiconductor device fabrication method, the semiconductor elements are preferably facet-emitting semiconductor laser elements, each of which emits a laser beam from a facet, and the inventive method preferably further includes the step (d) of forming the semiconductor laser elements in such a manner that their respective laser-beam-emitting facets extend ahead of a facet of the substrate. Then, a so-called shading phenomenon, in which the substrate causes a partial loss of the laser beams emitted from the respective semiconductor laser elements, is prevented.

In that case, a substrate, which is in the shape of a stripe when viewed from above, and which has a single row of recessed portions arranged so that the laser-beam-emitting facets of the respective semiconductor laser elements are aligned, is used as the substrate in the step (d).

When the semiconductor elements are the facet-emitting semiconductor laser elements, each of which emits a laser beam from a facet, the step (a) preferably includes a process in which a substrate electrode for contact with the periphery of the protruding portion of each semiconductor laser element is formed on the substrate around the periphery of each recessed portion. Then, the substrate electrode can be formed on the principal surface of the substrate, making it easier to form the electrode.

BRIEF DESCRIPTION OF THE DRAWINGS

FIG. 1A shows a plan view, FIG. 1B shows a front view and FIG. 1C shows a left-side view.

FIG. 9A is a flowchart, and FIG. 9B is a timing chart.

FIG. 11A is a plan view, FIG. 11B is a cross sectional view taken along the line XIb—XIb in FIG. 11A, and FIG. 11C is a cross sectional view after a wafer is rotated by 180 degrees from the state shown in FIG. 11B.

FIG. 12A is a plan view, FIG. 12B is a front view, and FIG. 12C is a left side view.

DESCRIPTION OF THE PREFERRED EMBODIMENTS

First Embodiment

Hereinafter, a first embodiment of the present invention will be described with reference to the accompanying drawings.

Figure 1A:
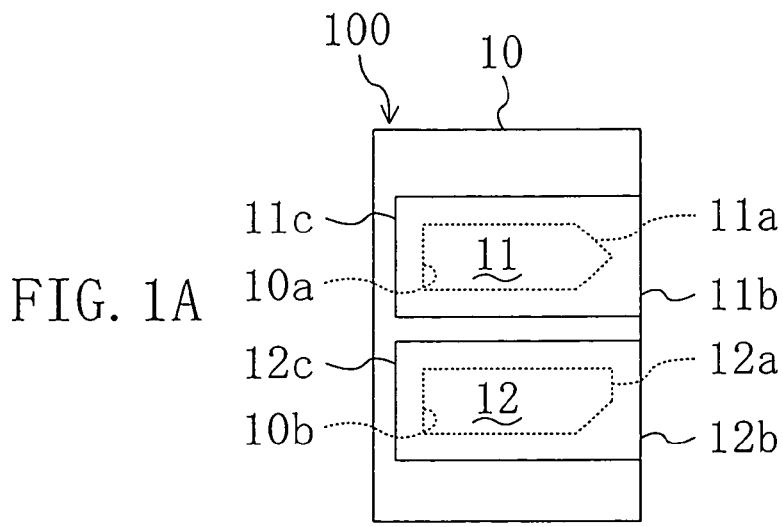
FIGS. 1A through 1C schematically illustrate a semiconductor laser device in accordance with a first embodiment of the present invention.
Figure 1B:
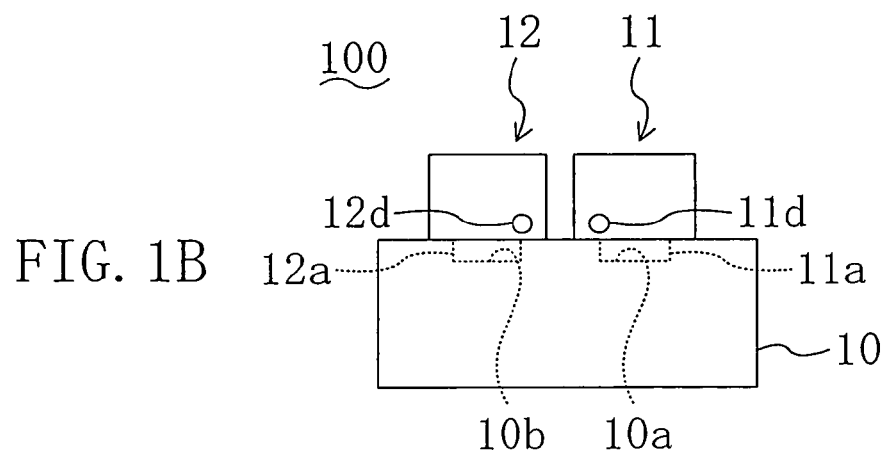
Figure 1C:
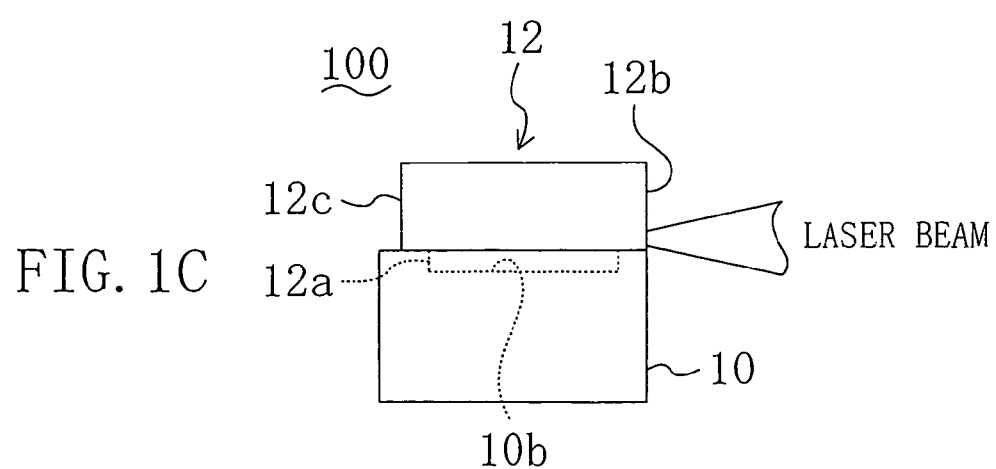

FIGS. 1A through 1C illustrate a semiconductor laser device in accordance with the first embodiment of the present invention. FIG. 1A shows a plan configuration, FIG. 1B shows a front configuration, and FIG. 1C shows a left-side configuration.

As shown in FIG. 1A, the semiconductor laser device 100 in accordance with the first embodiment includes a substrate 10, which is made of, e.g., silicon (Si) and which has first and second recessed portions 10a and 10b formed spaced apart from each other in the principal surface of the substrate 10.

Inserted in the first recessed portion 10a is a protruding portion 11a formed in the lower portion of a first semiconductor laser chip (semiconductor chip) 11 in the form of a function block, which emits, for example, an infrared laser beam. Inserted in the second recessed portion 10b is a protruding portion 12a formed in the lower portion of a second semiconductor laser chip (semiconductor chip) 12 in the form of a function block, which emits, e.g., a red laser beam.

The first and second semiconductor laser chips 11 and 12 are about 120 μm in thickness (height), about 800 μm in length in the longitudinal direction, and about 300 μm in width in the transverse direction. On the other hand, the first and second recessed portions 10a and 10b in the substrate 10 are each about 15 μm in depth. It should be noted that the depth of the respective recessed portions 10a and 10b may be about 5 μm to about 30 μm, in which case the depth dimension of the respective recessed portions 10a and 10b is preferably equal to or greater than the height dimension of the protruding portions 11a and 12a of the semiconductor laser chips 11 and 12.

The material forming the substrate 10 is not limited to silicon, but the substrate 10 may be made of gallium arsenide (GaAs), silicon carbide (SiC), or the like and is preferably made of a material having excellent thermal conductivity. The material forming the substrate 10 may be selected in accordance with the type of function block and the application of the semiconductor laser device 100, for example.

The emission wavelengths of the first and second semiconductor laser chips 11 and 12 are not limited to the above-described combination. For example, any two laser beams may be selected from infrared, red and blue laser beams. Moreover, a third recessed portion may be so formed in the substrate 10 as to be located alongside the first recessed portion 10a or the like, and semiconductor laser chips that emit three different laser beams may be placed. Furthermore, four or more recessed portions may be formed in the substrate 10, and semiconductor laser chips may be placed in the respective recessed portions.

The semiconductor laser device 100 is applicable for example in an optical pickup system (not shown) used in the reading or writing of data from or on an optical disc. In the first embodiment, the semiconductor laser chips 11 and 12 are both so-called facet-emitting semiconductor laser chips in which a semiconductor layer facet emits a laser beam. As shown in FIGS. 1B and 1C, the semiconductor laser chips 11 and 12 are disposed so that laser beams emitted from their respective laser-emitting facets 11b and 12b enter an objective lens (not shown) incorporated in the optical pickup system. Therefore, the laser-emitting facets 11b and 12b of the semiconductor laser chips 11 and 12 are located in alignment with each other, and the heights of their laser-emitting portions 11d and 12d are equal to each other.

As shown in FIG. 1A, the first embodiment is characterized by the plan configurations of the protruding portions 11a and 12a formed respectively in the lower portions of the first and second semiconductor laser chips 11 and 12. More specifically, the plan configuration of the protruding portion 11a is made pentagonal by cutting both corners alongside the laser-emitting facet 11b of the first semiconductor laser chip 11, while the plan configuration of the protruding portion 12a is made pentagonal by cutting one corner alongside the laser-emitting facet 12b of the second semiconductor laser chip 12. Accordingly, the plan configuration of the protruding portion 11a of the first semiconductor laser chip 11 has line symmetry in the laser-beam-emitting direction, but does not have line symmetry in a direction perpendicular to the laser-beam-emitting direction. On the other hand, the plan configuration of the protruding portion 12a of the second semiconductor laser chip 12 has neither line symmetry nor rotational symmetry.

As described above, in the first embodiment, the first and second semiconductor laser chips 11 and 12, which have different emission wavelengths and have been formed into the function blocks, are disposed so that their respective laser-beam-emitting directions are parallel with each other. Therefore, their laser-emitting portions 11d and 12d self-align with each other, such that wavefront aberration created in the optical system for the laser beams can be reliably reduced.

In addition, the depth dimension of the recessed portions 10a and 10b formed in the substrate 10, on which the first and second semiconductor laser chips 11 and 12 are to be mounted, is made greater than or equal to the height dimension of the protruding portions 11a and 12a of the semiconductor laser chips 11 and 12. This allows the protruding portions 11a and 12a of the semiconductor laser chips 11 and 12 to be reliably placed in the recessed portions 10a and 10b.

It should be noted that the first and second semiconductor laser chips 11 and 12 may be so configured as to have the same emission wavelength and different optical output values.

Also, the first and second semiconductor laser chips 11 and 12 may be designed in such a manner that optical output values from the respective laser-emitting facets 11b and 12b are equal to optical output values from the respective rear facets 11c and 12c.

Furthermore, the locations of the semiconductor laser chips 11 and 12 in the form of the function bocks are not limited to the first embodiment, but may be opposite to each other.

-Substrate Electrode-

In a case of a structure in which both p-side and n-side electrodes serving as chip electrodes for the first and second semiconductor laser chips 11 and 12 are formed at the principal surface side (upper side) of the substrate 10, no substrate electrodes have to be formed.

However, if the semiconductor laser chips 11 and 12 have chip electrodes of p-side and n-side electrodes, which are respectively formed on the upper face and protruding portion's periphery of each of the semiconductor laser chips 11 and 12 so as to face each other, substrate electrodes have to be provided on the peripheries of the recessed portions 10a and 10b.

Figure 2A:
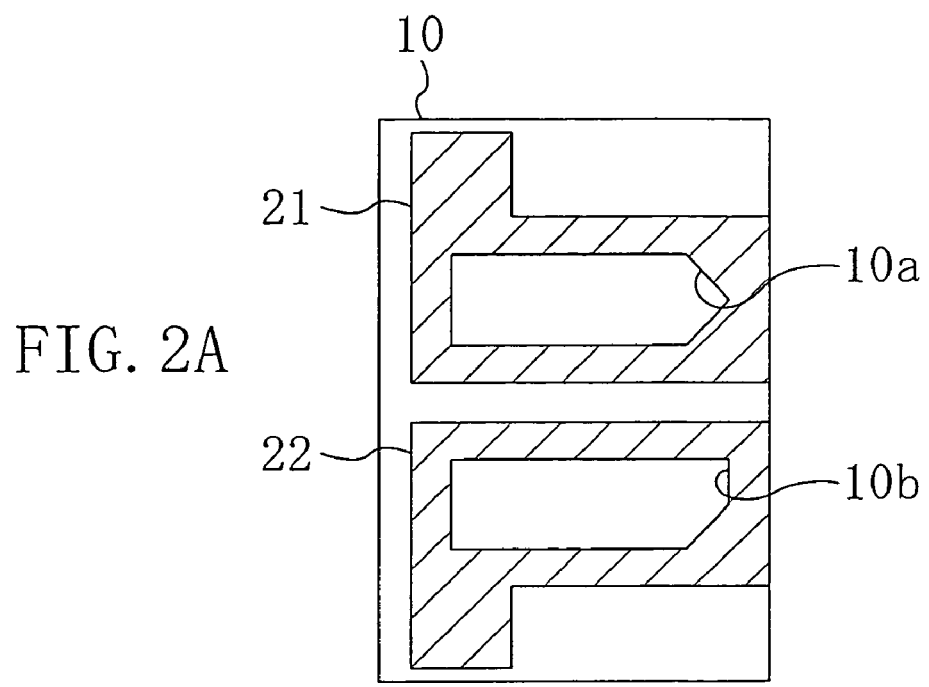
FIGS. 2A and 2B are plan views schematically illustrating recessed portions and substrate electrodes formed in the substrates of semiconductor laser devices in accordance with the first embodiment of the present invention.
Figure 2B:
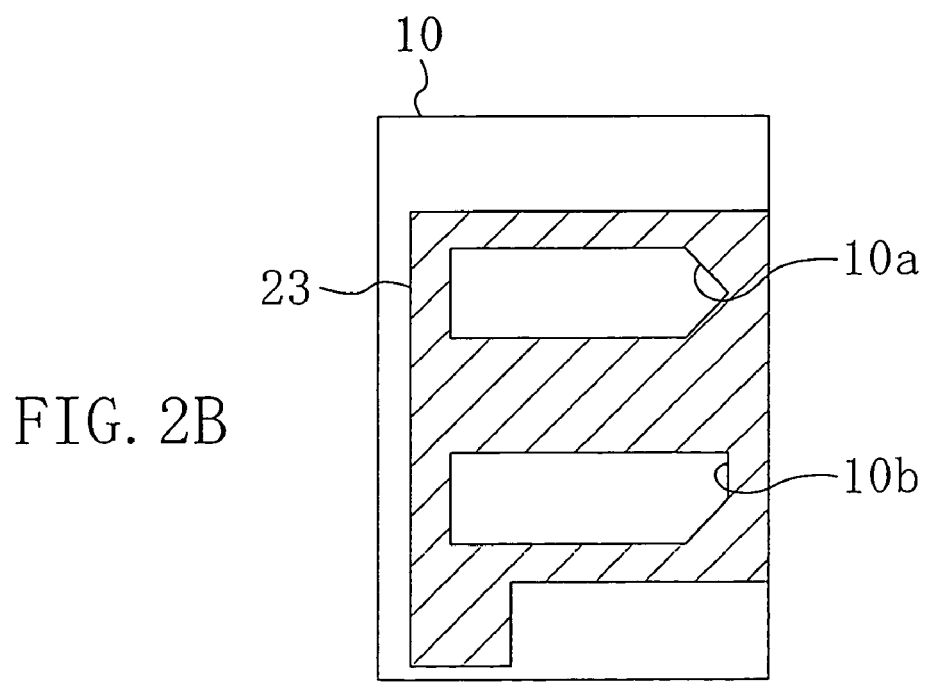

FIGS. 2A and 2B illustrate the plan configurations of two types of substrate electrodes.

FIG. 2A illustrates substrate electrodes according to a first example.

As shown in FIG. 2A, in order to drive the first and second semiconductor laser chips 11 and 12, first and second substrate electrodes 21 and 22 each made of a low-melting-point metal such as a solder material or the like are formed on the substrate 10 around the peripheries of the respective recessed portions 10a and 10b.

Therefore, after the semiconductor laser chips 11 and 12 in the form of the function blocks are respectively placed in the recessed portions 10a and 10b in the substrate 10 by a fluidic self-assembly technique, which will be discussed later, the chip electrodes of the semiconductor laser chips 11 and 12 can be electrically connected to the substrate electrodes 21 and 22 by heating the first and second substrate electrodes 21 and 22 to a degree at which the solder material melts.

Next, FIG. 2B illustrates a substrate electrode according to a second example. As shown in FIG. 2B, a common substrate electrode 23 made of a low-melting-point metal such as a solder material or the like is formed on the substrate 10 around the peripheries of the respective recessed portions 10a and 10b so that the common substrate electrode 23 surrounds the recessed portions 10a and 10b.

With the common substrate electrode 23 surrounding the first and second recessed portions 10a and 10b, even if the first and second semiconductor laser chips 11 and 12 have different laser-emission wavelengths, the chip electrodes on the bottom faces of the semiconductor laser chips, which form a laser chip array, can be connected to each other.

(Method for Fabricating Semiconductor Laser Devices)

Hereinafter, it will be described how to fabricate the semiconductor laser device of the first embodiment of the present invention with reference to the accompanying drawings.

The semiconductor laser chips 11 and 12 in the form of the function blocks, for example, can be placed in the recessed portions 10a and 10b in the substrate manually or by assembly equipment. However, an object of the present invention is to significantly increase the efficiency of the placing (mounting) process of the semiconductor laser chips 11 and 12 by using the above-mentioned fluidic self-assembly technique.

-Method for Forming Substrates-

First, an exemplary method for forming the substrate 10 will be described.

FIGS. 3A through 3E are cross-sectional views illustrating process steps for forming the recessed portions in the substrate of the semiconductor laser device in accordance with the first embodiment of the present invention. In the figures, a case in which a wafer 10A made of silicon is used is indicated, and by focusing attention only on the first recessed portion 10a, those figures illustrate cross sections taken in a vertical direction with respect to the emission direction.

Figure 3A:
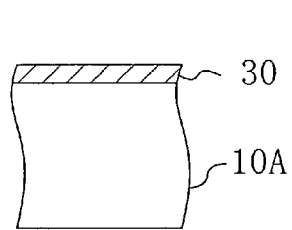
FIGS. 3A through 3E are cross-sectional views illustrating process steps for forming the substrate of a semiconductor laser device in accordance with the first embodiment of the present invention.

First, as shown in FIG. 3A, a mask film 30 of silicon dioxide ($SiO_2$) is deposited to a thickness of about 0.7 µm to 1 µm on the principal surface of the wafer 10A by a CVD process, for example.

Figure 3B:
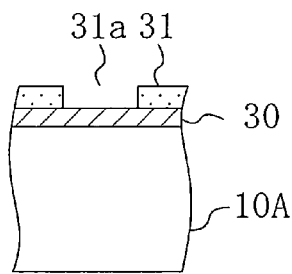

Next, as shown in FIG. 3B, a resist pattern 31 having an opening pattern 31a for the first recessed portion 10a is selectively formed by lithography.

Figure 3C:
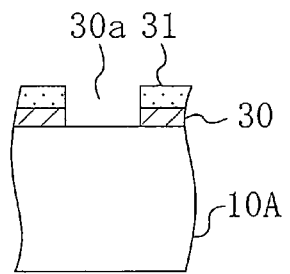

Then, as shown in FIG. 3C, with the resist pattern 31 used as a mask, the mask film 30 is dry-etched using., e.g., fluorocarbon as an etching gas, thereby transferring the opening pattern 30a for the first recessed portion 10a to the mask film 30.

Figure 3D:
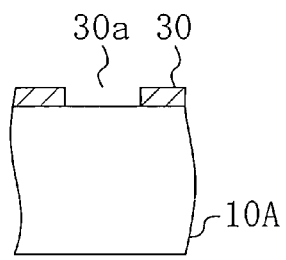
Figure 3E:
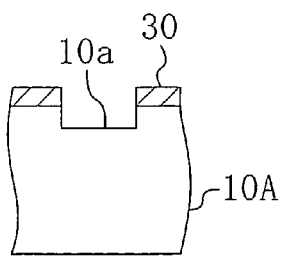

Subsequently, as shown in FIG. 3D, the resist pattern 31 is removed by ashing or the like. Thereafter, as shown in FIG. 3E, with the mask film 30 having the opening pattern 30a acting as a mask, the wafer 10A is dry-etched using, e.g., chlorine ($Cl_2$) or hydrogen bromide (HBr) as an etching gas, thereby forming the first recessed portion 10a with a depth of about 15 µm in the wafer 10A. In this method, the type of etching performed for the wafer 10A is not limited to the dry etching, but the wafer 10A may be wet-etched using a mixed solution of hydrofluoric acid and nitric acid. The second recessed portion 10b is formed in the same manner as, and at the same time with, the first recessed portion 10a. Subsequently, the wafer 10A in which the recessed portions 10a have been formed is washed with water and then dried.

Figure 4:
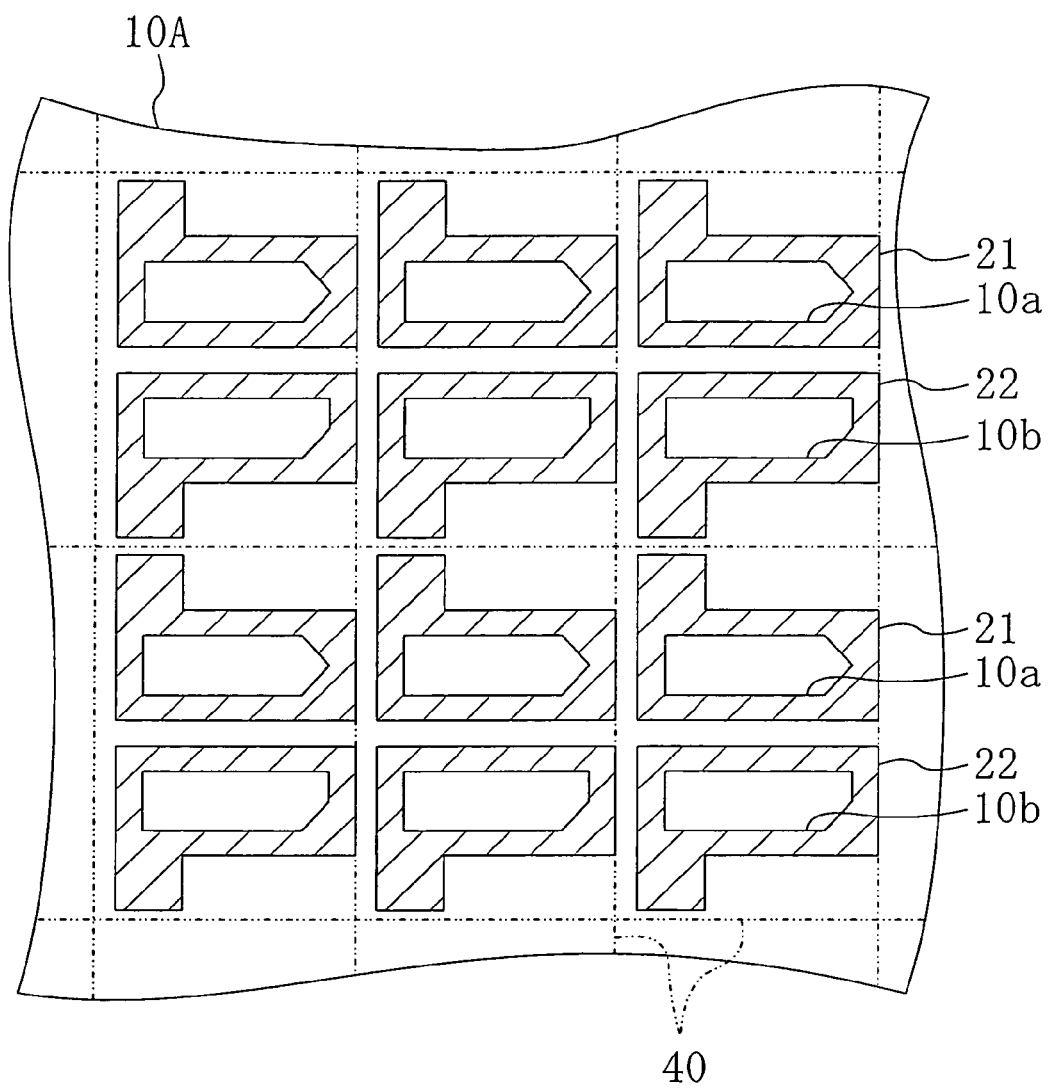
FIG. 4 is a plan view illustrating wafer-state substrates of semiconductor laser devices in accordance with the first embodiment of the present invention, before semiconductor elements are mounted.

Thereafter, as shown in FIG. 4, if substrate electrodes are necessary, substrate electrodes 21 and 22 such as shown in FIG. 2A, for example, are selectively formed on the mask film 30 on the wafer 10A to surround the peripheries of the respective recessed portions 10a and 10b. A reference numeral 40 indicates dicing lines along which the wafer 10A is cut into the substrates 10.

-First Method for Forming Semiconductor Laser Chips (Function Blocks)-

Hereinafter, a method for forming the semiconductor laser chips will be described.

FIGS. 5A through 5D are cross-sectional views illustrating process steps of a first method for forming the semiconductor laser chips in the semiconductor laser device in accordance with the first embodiment of the present invention.

Figure 5A:
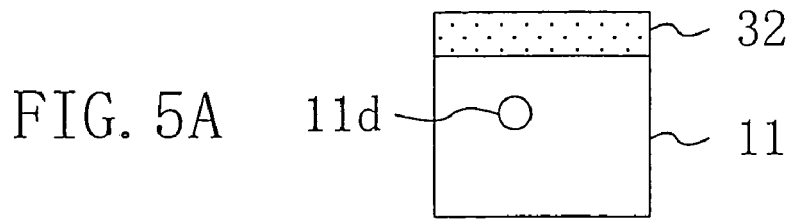
FIGS. 5A through 5D are cross-sectional views illustrating process steps of a first method for forming a semiconductor laser chip in a semiconductor laser device in accordance with the first embodiment of the present invention.

First, as shown in FIG. 5A, a resist film 32 is applied onto the entire surface of the first semiconductor laser chip 11 which is located close to its laser-emitting portion 11d (active layer). Although not shown, the first semiconductor laser chip 11 is in a wafer state, for example.

Figure 5B:
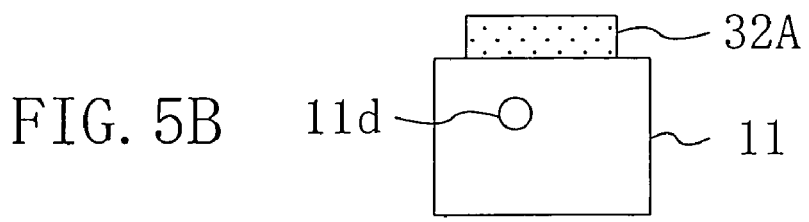

Next, as shown in FIG. 5B, a resist pattern 32A having a pattern for the first recessed portion 10a is formed out of the resist film 32 by lithography.

Figure 5C:
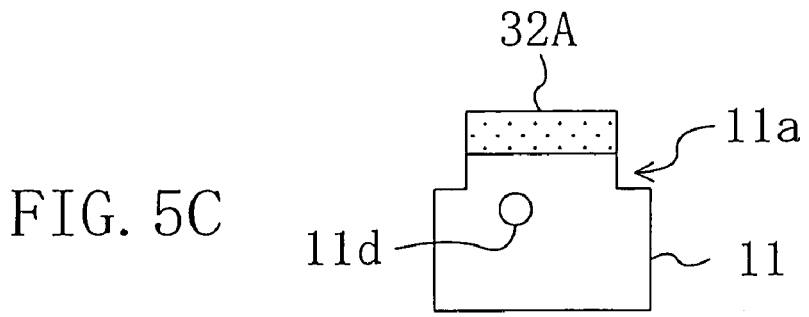

Then, as shown in FIG. 5C, with the resist pattern 32A acting as a mask, the first semiconductor laser chip 11 is dry-etched using silicon tetrachloride ($SiCl_4$) or sulfur hexafluoride ($SF_6$), for example, as an etching gas. In this manner, the protruding portion 11a of the first semiconductor laser chip 11 is formed so as to be placed in the first recessed portion 10a.

Figure 5D:
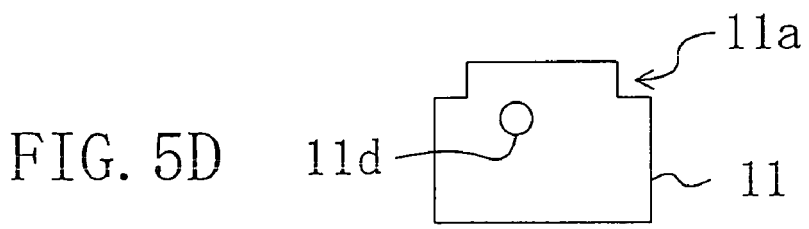

Then, as shown in FIG. 5D, the resist pattern 32A is removed. Subsequently, the first semiconductor laser chip 11 is washed with an organic solvent such as acetone or the like and then dried. Thereafter, the first semiconductor laser chips 11 in a wafer state are divided into chips.

Next, the protruding portion 12a of the second semiconductor laser chip 12 is formed in the same manner as for the first semiconductor laser chip 11, so as to be placed in the second recessed portion 10b.

Needless to say, either the first or second semiconductor laser chips 11 or 12 may be formed first.

-Second Method for Forming Semiconductor Laser Chips-

Hereinafter, a second method for forming the semiconductor laser chips in accordance with the first embodiment will be described with reference to FIGS. 6A through 6D.

Figure 6A:
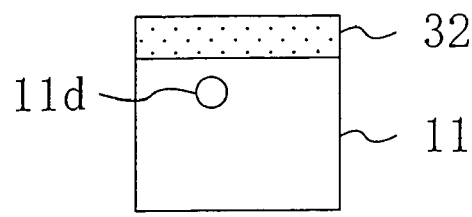
FIGS. 6A through 6D are cross-sectional views illustrating process steps of a second method for forming a semiconductor laser chip in a semiconductor laser device in accordance with the first embodiment of the present invention.

First, as shown in FIG. 6A, a resist film 32 is applied onto the entire surface of the first semiconductor laser chip 11 which is located close to its laser-emitting portion 11d. In this method, the first semiconductor laser chip 11 is also in a wafer state.

Figure 6B:
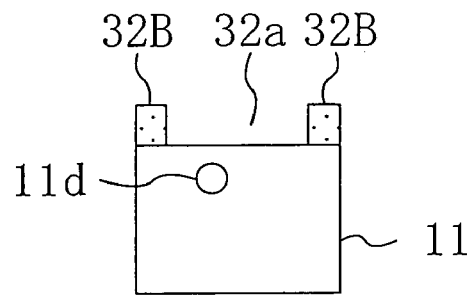

Next, as shown in FIG. 6B, a resist pattern 32B having an opening pattern 32a for forming the protruding portion 11a is formed out of the resist film 32 by lithography.

Figure 6C:
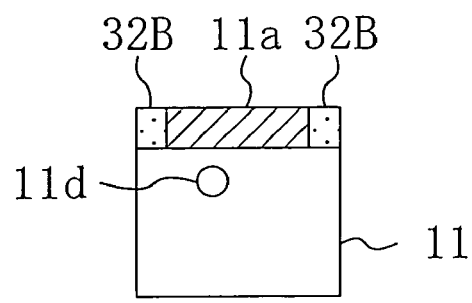

Then, as shown in FIG. 6C, with the resist pattern 32B acting as a mask, the protruding portion 11a made of a plating material is formed by a plating process in the opening 32a formed on the first semiconductor laser chip 11.

Figure 6D:
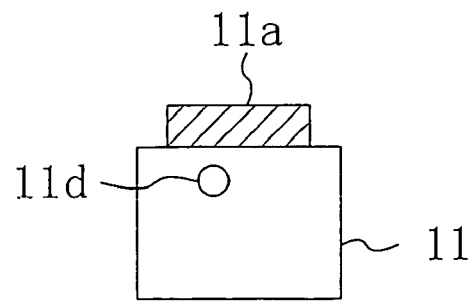

Thereafter, as shown in FIG. 6D, the resist pattern 32B is removed by ashing or the like. In this manner, the protruding portion 11a made of the metal formed by the plating process is formed on the first semiconductor laser chip 11 surface which is located close to the laser-emitting portion 11d. Then, the protruding portion 12a is formed for the second semiconductor laser chip 12 in the same manner as for the first semiconductor laser chip 11.

As described above, in the second formation method, processes in which the semiconductor chips themselves are etched can be omitted.

-Third Method for Forming Semiconductor Laser Chips-

Next, a third method for forming the semiconductor laser chips in accordance with the first embodiment will be described with reference to FIGS. 7A and 7B.

Figure 7A:
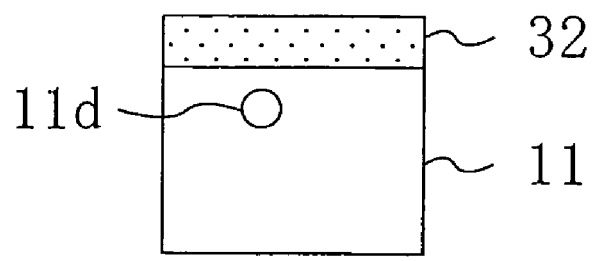
FIGS. 7A and 7B are cross-sectional views illustrating process steps of a third method for forming a semiconductor laser chip in a semiconductor laser device in accordance with the first embodiment of the present invention.

First, as shown in FIG. 7A, a resist film 32 is applied onto the entire surface of the wafer-state first semiconductor laser chip 11 which is located close to its laser-emitting portion 11d.

Figure 7B:
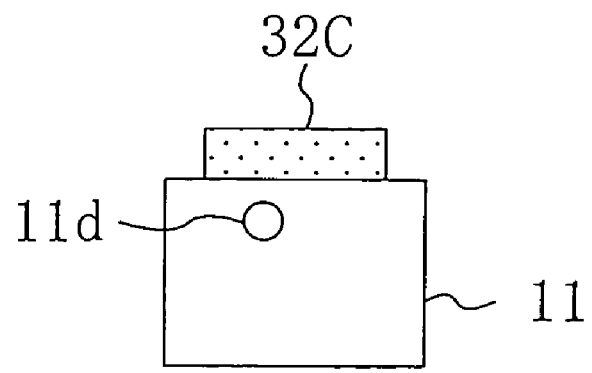

Next, as shown in FIG. 7B, the resist film 32 is patterned by lithography to a shape that corresponds to the protruding portion 11a. The patterned resist film is then subjected to a baking process, thereby forming a protruding portion 32C made of the resist material on the first semiconductor laser chip 11 surface that is located close to the laser-emitting portion 11d. Then, a protruding portion 32C that corresponds to the protruding portion 12a is formed for the second semiconductor laser chip 12 in the same manner as for the first semiconductor laser chip 11.

As described above, in the third formation method, the protruding portions of the semiconductor laser chips 11 and 12 can be formed just by patterning the photosensitive organic resin material.

It should be noted that instead of the resist film 32, a photosensitive organic material such as polyimide, benzo cyclo butene (BCB), acrylic, or the like may be used.

-Method for Mounting Semiconductor Laser Chips-

Hereinafter, it will be described how to mount the semiconductor laser chips. A method for mounting semiconductor laser chips in accordance with the first embodiment employs a fluidic self-assembly technique as a method for placing the first and second semiconductor laser chips 11 and 12 in the form of the function blocks in the recessed portions 10a and 10b formed in the wafer 10A. Use of the fluidic self-assembly technique of this embodiment enables the semiconductor laser chips 11 and 12 in the form of the function blocks to be disposed in the desired locations precisely and highly efficiently.

In the fluidic self-assembly technique, the function blocks are spread in a liquid (medium) such as water ($H_2O$) or methyl alcohol ($CH_3OH$). Thus, in cases of assembling two-wavelength laser chip arrays, the protruding portions 11a and 12a preferably have different plan configurations as in the first and second semiconductor laser chips 11 and 12.

First, if the substrate electrodes 21 or the like are formed on the wafer 10A in which the first and second recessed portions 10a and 10b have been formed, a solder material is applied onto the substrate electrodes. On the other hand, in cases where no substrate electrodes are formed, a thermosetting adhesive, a UV-setting adhesive or the like may be applied.

Now, (fluidic self-assembly) equipment for mounting the function blocks onto the substrate will be briefly described.

Figure 8:
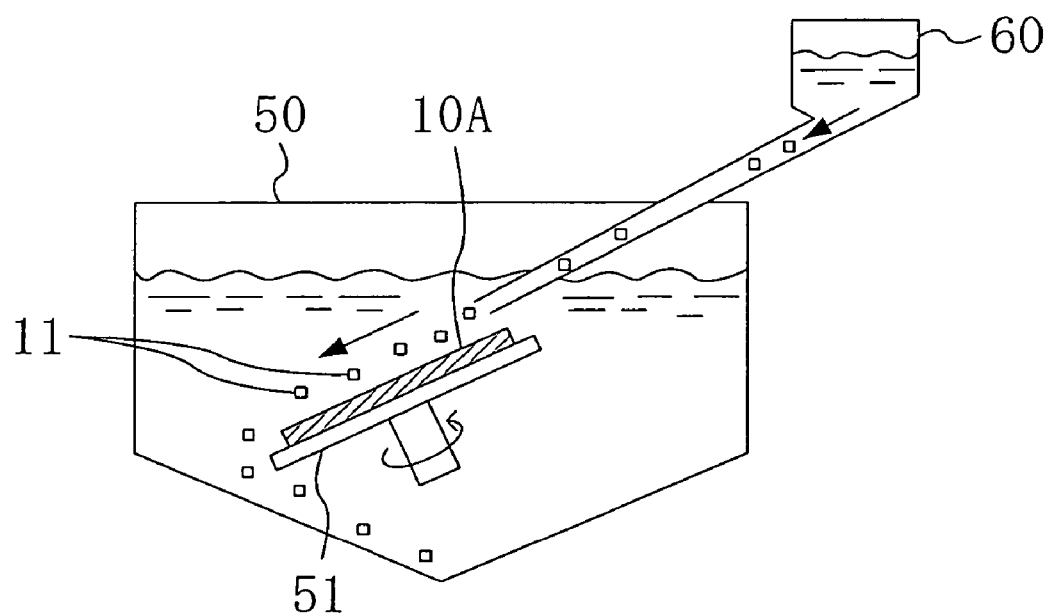
FIG. 8 is a schematic view illustrating the configuration of mounting (placing) equipment used in a semiconductor laser device fabrication method in accordance with the first embodiment of the present invention.

FIG. 8 schematically shows equipment for mounting a plurality of the semiconductor laser chips 11 and 12 in the form of the function blocks.

As shown in FIG. 8, the equipment in accordance with the first embodiment includes a receptacle 50, a wafer holder 51, and a chip-charging portion 60. The receptacle 50 holds a liquid such as water ($H_2O$) or methyl alcohol ($CH_3OH$), and in the receptacle 50, the mounting is carried out. The wafer holder 51 provided on the bottom of the receptacle 50 is capable of rotating and holds the wafer 10A on its upper face. The liquid in the form of slurry, in which the semiconductor laser chips 11 and 12 in the form of the function blocks have been spread, is charged into the receptacle 50 from the chip-charging portion 60. The upper face of the wafer holder 51 is preferably located slantingly with respect to the surface of the liquid.

Subsequently, the wafer 10A, in which a plurality of the first and second recessed portions 10a and 10b have been formed, is held on the wafer holder 51.

Thereafter, a liquid in which a plurality of the first semiconductor laser chips 11 have been spread, is poured over the principal surface of the wafer 10A that is held on the upper face of the wafer holder 51 in a slanting position. In this process, the first semiconductor laser chips 11 are placed in the respective first recessed portions 10a formed in the wafer 10A.

It should be noted that the specific gravity of the liquid is preferably smaller than the specific gravities of the semiconductor laser chips 11 and 12 so that the chips do not float in the liquid surface. Moreover, the specific gravity of the liquid is preferably adjusted so that the semiconductor laser chips 11 and 12 are disposed in a self-aligned manner at optimum efficiency. For example, if methyl alcohol is used as a principal element of the liquid (dispersion medium), addition of water increases the specific gravity of the dispersion medium, thereby allowing the semiconductor chips to fall in the dispersion medium and to slide on the wafer 10A at slower rates. As described above, the maximization of the disposition efficiency is preferably achieved by adjusting the specific gravity of the liquid and thereby adjusting the falling rate and sliding rate of the semiconductor chips.

Figure 9A:
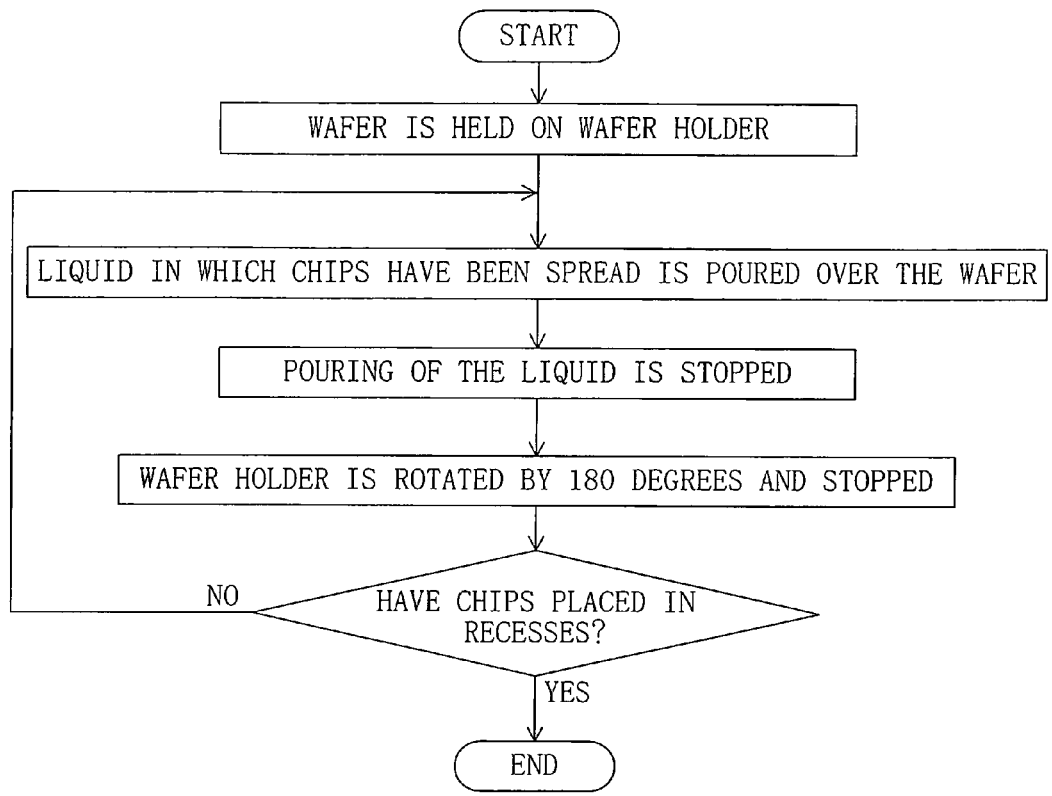
FIGS. 9A and 9B indicate a semiconductor laser device fabrication method in accordance with the first embodiment of the present invention.
Figure 9B:
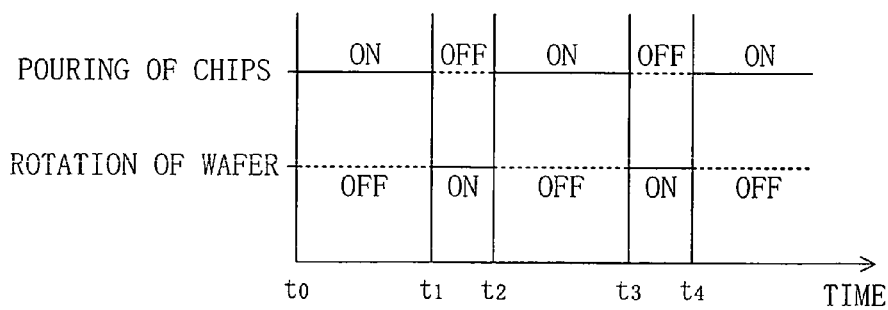

In the first embodiment, as shown in a flowchart and a time chart in FIGS. 9A and 9B, rotation of the wafer holder 51 is stopped in a period of time in which the semiconductor laser chips 11 are poured over the principal surface of the wafer 10A. On the other hand, when the wafer holder 51 is rotated, the pouring of the semiconductor laser chips 11 is stopped. The rotation angle of the wafer holder 51 is preferably an integral multiple of 90 degrees, and is more preferably, 180 degrees, as will be described later. Then, when the semiconductor chips are poured, the wafer 10A stands still, so that the semiconductor chips are placed in the recessed portions more easily as compared with cases in which the wafer 10A is rotated all the time.

In addition, since the wafer 10A held in the liquid is rotated in its principal surface only at a predetermined angle, even if the first semiconductor laser chips 11 are designed so that only the protruding portions 11a thereof are inserted in the first recessed portions 10a, the first semiconductor laser chips 11 are mounted reliably. The reasons for this will be described with reference to FIGS. 10A and 10B and FIGS. 11A through 11C.

Figure 10A:
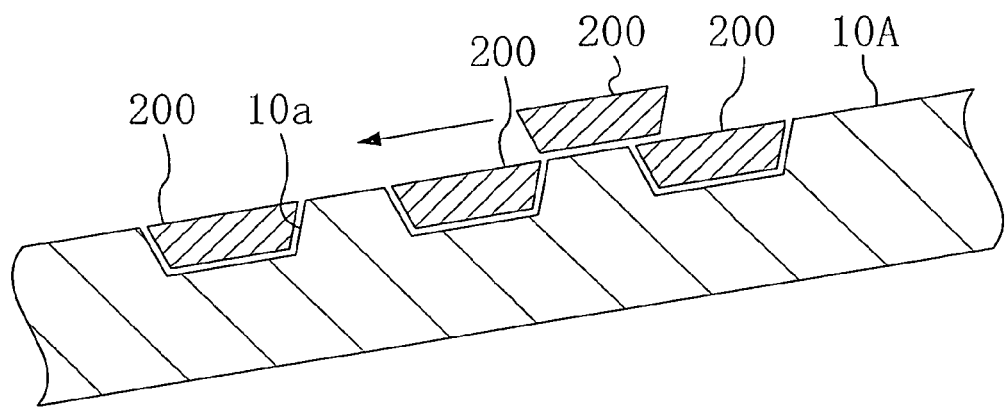
FIG. 10A is a cross sectional view schematically illustrating a conventional method for mounting function blocks by using a fluidic self-assembly technique.

As shown in FIG. 10A, in the conventional fluidic self-assembly technique, function blocks 200 are designed so as to be placed entirely in recessed portions 10a formed in a wafer 10A. Thus, those function blocks 200 that have been once placed in the recessed portions 10a do not obstruct the flow of the other function blocks 200.

Figure 10B:
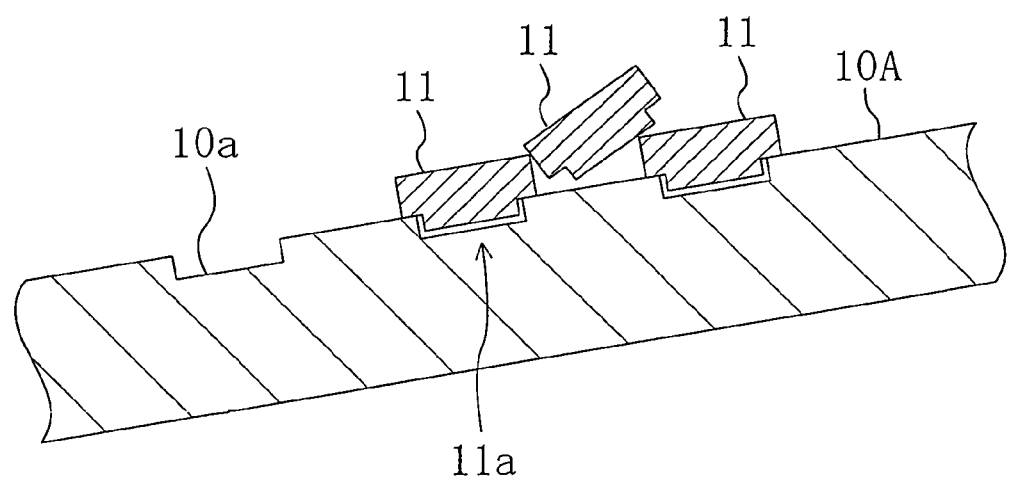
FIG. 10B is a cross sectional view schematically illustrating an aspect of a mounting process performed using a fluidic self-assembly technique in the semiconductor laser device fabrication method in accordance with the first embodiment of the present invention.

However, as shown in FIG. 10B, in the present invention, only the protruding portions 11a of the first semiconductor laser chips 11 are inserted in the recessed portions 10a formed in the wafer 10A. Due to this structure, the semiconductor laser chips 11 that have been placed in the recessed portions 10a each have a portion projecting from the surface of the wafer 10A, and such projecting portions would be in the way of the other semiconductor laser chips 11 flowing on the surface of the wafer 10A, resulting in decreased mounting throughput (efficiency). Therefore, in the first embodiment, the wafer 10A is rotated in the liquid when the pouring of the semiconductor chips is stopped, as shown in FIG. 8.

Then, those first semiconductor laser chips 11 obstructed by the first semiconductor laser chips 11 that have already been placed in the recessed portions 10a flow down so as to be poured in the next pouring.

Figure 11A:
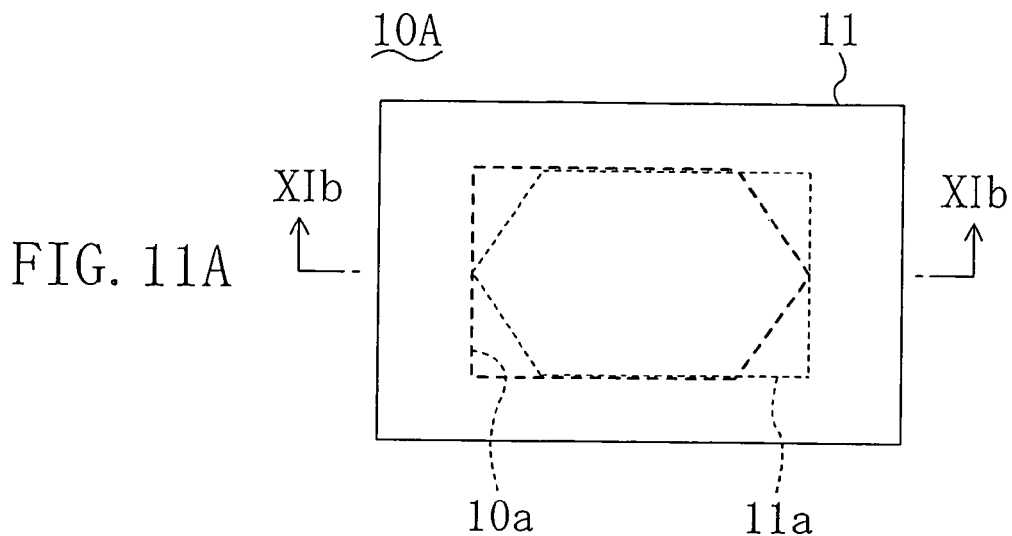
FIGS. 11A through 11C schematically indicate other aspects of the mounting process performed using a fluidic self-assembly technique in the semiconductor laser device fabrication method in accordance with the first embodiment of the present invention.
Figure 11B:
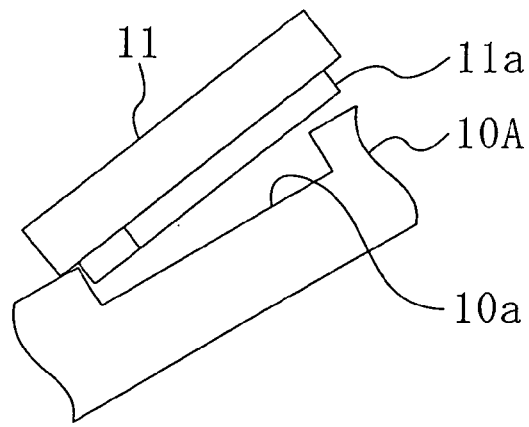

Moreover, the protruding portions 11a of the first semiconductor laser chips 11 of the first embodiment, and the first recessed portions 10a of the wafer 10A, in which the protruding portions 11a are inserted, have directional property. Therefore, as shown in FIG. 11A and FIG. 11B, which is the cross sectional view taken along the line XIb—XIb in FIG. 11A, there are cases where the first semiconductor laser chip 11 is placed in the first recessed portion 10a in the wafer 10A in the opposite direction, or is caught in the second recessed portion 10b (not shown) without being placed properly therein.

Figure 11C:
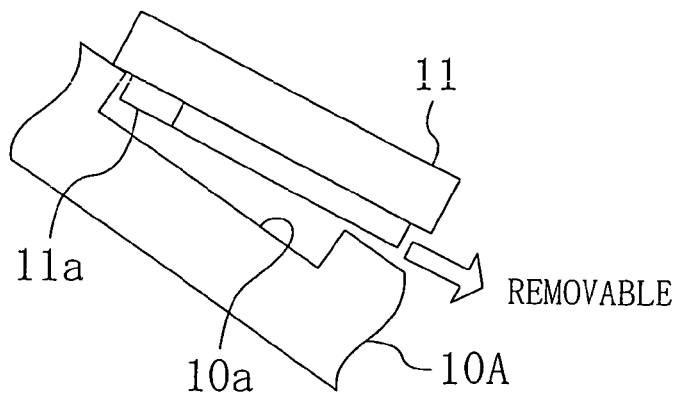

In view of this, in the first embodiment, the wafer holder 51 is rotated by an integral multiple of 90 degrees, and more preferably, by 180 degrees, thereby reliably removing the first semiconductor laser chip 11 caught in the first recessed portion 10a in an improper direction, as shown in FIG. 11C.

The liquid in which the first semiconductor laser chips 11 have been spread is poured repeatedly until the mounting of the first semiconductor laser chips 11 into the first recessed portions 10a in the wafer 10A is completed. Thereafter, the second semiconductor laser chips 12 are placed in the second recessed portions 10b formed in the wafer 10A by using a liquid in which the second semiconductor laser chips 12 in the form of the function blocks have been spread. It should be noted that either the first semiconductor laser chips 11 or the second semiconductor laser chips 12 may be mounted first. Furthermore, the semiconductor laser chips 11 and 12 may be poured at the same time.

Thereafter, the first and second semiconductor laser chips 11 and 12 are secured. For example, when the securing is performed by using a solder material or a thermosetting adhesive, the wafer 10A is heated. Alternatively, when a UV-setting adhesive is used for the securing, the entire surface of the wafer 10A is irradiated with ultraviolet light. Subsequently, the wafer 10A is cut using a dicing saw or the like, along the dicing lines 40 shown in FIG. 4, thereby cutting each semiconductor laser device 100.

As described above, according to the semiconductor laser device fabrication method of the first embodiment, the mounting process can be significantly simplified. In addition, since only the semiconductor laser chips 11 and 12 that have been determined as being non-defective can be mounted, the cost of the semiconductor laser devices 100 can be reduced.

Furthermore, the use of the fluidic self-assembly technique in the mounting of the semiconductor laser chips onto the wafer 10A permits the semiconductor laser chips to self-align with each other, which increases yields.

Moreover, since only the protruding portions 11a and 12a formed in the lower portions of the respective semiconductor laser chips 11 and 12 are inserted in the recessed portions 10a and 10b formed in the principal surface of the wafer 10A, each of the semiconductor laser chips 11 and 12 can be mounted in a self-aligned manner with respect to its upper and bottom (top and bottom) direction as well. Moreover, the depth of the recessed portions 10a and 10b formed in the wafer 10A does not have to be made so great as to allow the semiconductor chips to be entirely inserted in the recessed portions 10a and 10b. This facilitates the process of forming the recessed portions 10a and 10b, which increases throughput in the recess formation process as well.

Furthermore, as shown in FIG. 9B, the wafer 10A is not rotated in the first period of time ($t_0$ to $t_1$, for example) in which the semiconductor chips are poured. On the other hand, the semiconductor chips are not poured in the second period of time ($t_1$ to $t_2$, for example) in which the wafer 10A is rotated. By this method, throughput in the mounting of the semiconductor chips onto the wafer 10A is reliably increased.

Second Embodiment

Hereinafter, a second embodiment of the present invention will be described with reference to the accompanying drawings.

Figure 12A:
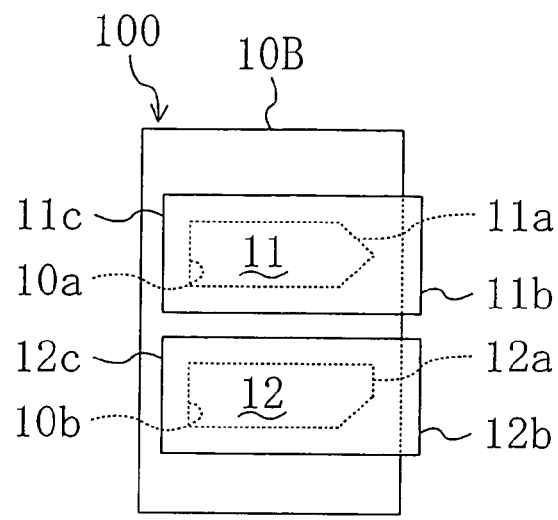
FIGS. 12A through 12C schematically illustrate a semiconductor laser device in accordance with a second embodiment of the present invention.
Figure 12B:
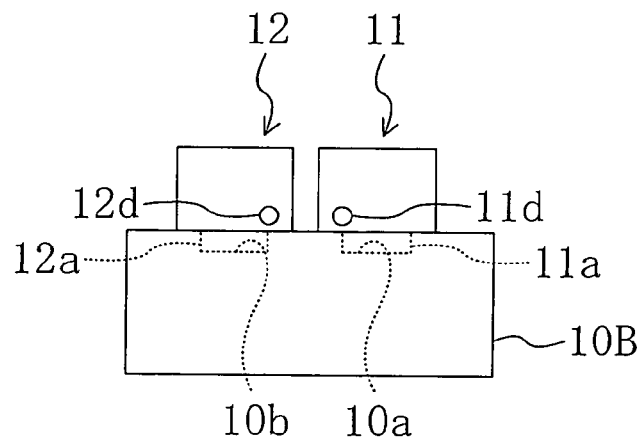
Figure 12C:
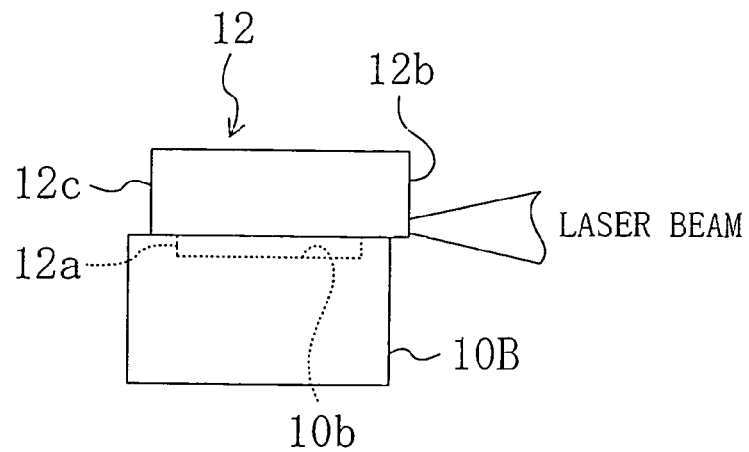

FIGS. 12A through 12C illustrate a semiconductor laser device in accordance with the second embodiment of the present invention. FIG. 12A shows a plan configuration, FIG. 12B shows a front configuration, and FIG. 12C shows a left side configuration. In FIGS. 12A through 12C, the same members as those shown in FIGS. 1A thuough 1C are identified by the same reference numerals and the descriptions thereof will be omitted herein.

As shown in FIGS. 12A through 12C, a substrate 10B included in the semiconductor laser device 100 according to the second embodiment is characterized in that laser-beam-emitting facets 11b and 12b of semiconductor laser chips 11 and 12 are formed extending ahead of the front facet of the substrate 10B.

This prevents laser beams emitted by the respective semiconductor laser chips 11 and 12 from being partially lost due to the front facet of the substrate 10B.

Figure 13:
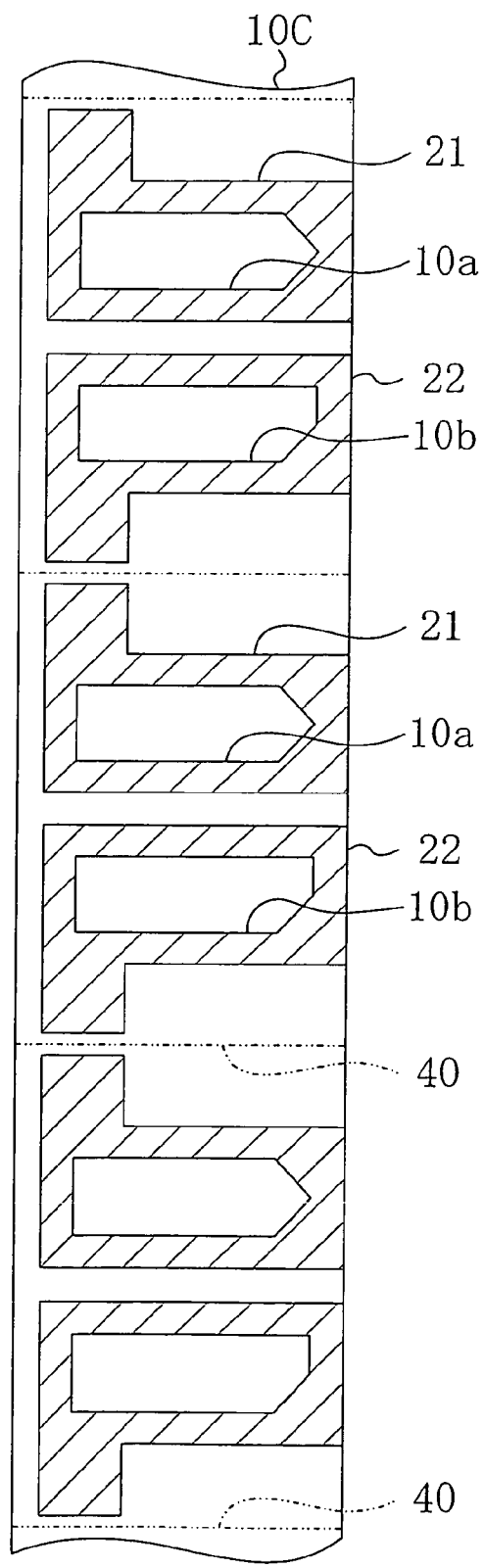
FIG. 13 is a plan view illustrating a stripe-shaped substrate of semiconductor laser devices in accordance with the second embodiment of the present invention, before semiconductor elements are mounted.

As shown in FIG. 13, a mounting method for the semiconductor laser device 100 in accordance with the second embodiment, in which a substrate 10C is used instead of the wafer 10A, is performed by a fluidic self-assembly process similar to that of the first embodiment. The substrate 10C, which is in the shape of a stripe when viewed from above, has a single row of recessed portions 10a and 10b arranged so that the laser-emitting facets of the respective semiconductor laser chips 11 and 12 are aligned. The end portion of the substrate 10C alongside the laser-emitting facets 11b and 12b of the semiconductor laser chips 11 and 12 is located behind the laser-emitting facets 11b and 12b.

In this embodiment, in the mounting substrate 10C, the single row of the recessed portions 10a and 10b are formed for the semiconductor laser chips 11 and 12. However, if the recessed portions 10a and 10b are formed in such a manner that the rear facets of the semiconductor laser chips 11 and 12 oppose each other, it is possible to form two rows of the recessed portions 10a and 10b in the mounting substrate 10C.

It should be noted that the present invention is not limited to semiconductor laser devices, but may be applicable to semiconductor devices in which light emitting diodes or other function elements are mounted by inserting part of each diode or element in a recessed portion formed in the substrate.

What is claimed is:

1. A method for fabricating a semiconductor device, comprising the steps of:
   (a) forming a plurality of recessed portions in the principal surface of a substrate, and
   (b) spreading in a liquid a plurality of semiconductor elements, each of which is in the form of a chip and has, in its lower portion, a protruding portion that is inserted in one of the recessed portions, and pouring the semiconductor-element-spread liquid over the principal surface of the substrate, thereby allowing the semiconductor elements to be placed in the respective recessed portions in a self-aligned manner,
   wherein the step (b) includes a first period of time in which the semiconductor-element-spread liquid is poured over the principal surface of the substrate, and a second period of time in which the semiconductor-element-spread liquid is not poured over the principal surface of the substrate, and
   the substrate is not rotated in the first period of time, while the substrate is rotated in the second period of time.

2. The method of claim 1, wherein in the second period of time, the substrate is rotated in the principal surface thereof by at least 90 degrees.

3. The method of claim 1, wherein the step (b) includes a process in which the first period of time and the second period of time are repeated alternately.

4. The method of claim 1, wherein the substrate is held with the principal surface thereof being slanting with respect to a horizontal direction.

5. The method of claim 1, wherein the protruding portion of each semiconductor element has a plan configuration which does not have line symmetry at least with respect to one of two intersecting axes, or has a plan configuration which does not have rotational symmetry.

6. The method of claim 1, wherein in the step (a), the depth dimension of the recessed portions is greater than or equal to the height dimension of the protruding portions of the semiconductor elements.

7. The method of claim 1, further comprising, before the step (b), the step (c) of forming the semiconductor elements into the chips,
   wherein the protruding portions of the semiconductor elements are formed by an etching process in the step (c).

8. The method of claim 1, further comprising, before the step (b), the step (c) of forming the semiconductor elements into the chips,
   wherein the protruding portions of the semiconductor elements are formed of a plating material in the step (c).

9. The method of claim 1, further comprising, before the step (b), the step (c) of forming the semiconductor elements into the chips,
   wherein the protruding portions of the semiconductor elements are formed of a resist material in the step (c).

10. The method of claim 1, further comprising, before the step (b), the step (c) of forming the semiconductor elements into the chips, wherein the protruding portions of the semiconductor elements are formed of a polyimide material in the step (c).

11. The method of claim 10, wherein the polyimide material is photosensitive.

12. The method of claim 1, further comprising, before the step (b), the step (c) of forming the semiconductor elements into the chips, wherein the protruding portions of the semiconductor elements are formed of a benzo cyclo butene (BCB) material in the step (c).

13. The method of claim 12, wherein the benzo cyclo butene material is photosensitive.

14. The method of claim 1, further comprising, before the step (b), the step (c) of forming the semiconductor elements into the chips, wherein the protruding portions of the semiconductor elements are formed of an acrylic material in the step (c).

15. The method of claim 14, wherein the acrylic material is photosensitive.

16. The method of claim 1, wherein the liquid is an organic solvent.

17. The method of claim 1, wherein the specific gravity of the liquid is smaller than the specific gravity of the semiconductor elements, and the step (b) includes a process in which the specific gravity of the liquid is adjusted so that the semiconductor elements are disposed on the substrate in a self-aligned manner at a maximum efficiency.

18. The method of claim 1, wherein the semiconductor elements are facet-emitting semiconductor laser elements, each of which emits a laser beam from a facet, and the method further includes the step (d) of forming the semiconductor laser elements in such a manner that their respective laser-beam-emitting facets extend ahead of a facet of the substrate.

19. The method of claim 18, wherein a substrate, which is in the shape of a stripe when viewed from above, and which has a single row of recessed portions arranged so that the laser-beam-emitting facets of the respective semiconductor laser elements are aligned, is used as the substrate in the step (d).

20. The method of claim 18, wherein the step (a) includes a process in which a substrate electrode for contact with the periphery of the protruding portion of each semiconductor laser element is formed on the substrate around the periphery of each recessed portion.

21. The method of claim 19, wherein the step (a) includes a process in which a substrate electrode for contact with the periphery of the protruding portion of each semiconductor laser element is formed on the substrate around the periphery of each recessed portion.

* * * * *